United States Patent [19]

Abe et al.

[11] Patent Number: 4,742,519

[45] Date of Patent: May 3, 1988

[54] APPARATUS FOR DECODING ERROR CORRECTING CODE

[75] Inventors: Takao Abe; Kaichi Tatsuzawa; Hisanori Kominami; Tetsuro Suma; Tetsuo Ogawa; Hiroki Kotani, all of Kanagawa, Japan

[73] Assignee: Sony Corporation, Tokyo, Japan

[21] Appl. No.: 865,126

[22] Filed: May 20, 1986

[30] Foreign Application Priority Data

May 21, 1985 [JP] Japan .................................. 60-108880
May 25, 1985 [JP] Japan .................................. 60-112772

[51] Int. Cl.⁴ .............................................. G06F 11/10
[52] U.S. Cl. ...................................... 371/38; 360/38.1
[58] Field of Search ................. 371/2, 38, 39, 40; 360/38.1; 358/314

[56] References Cited

U.S. PATENT DOCUMENTS

| | | | |
|---|---|---|---|
| 3,657,699 | 4/1972 | Rocher et al. ................. | 371/2 X |
| 4,211,997 | 7/1980 | Rudnick et al. ................. | 371/38 |
| 4,336,612 | 6/1982 | Inoue et al. ................. | 371/39 |
| 4,394,642 | 7/1983 | Currie et al. ................. | 371/40 X |
| 4,447,902 | 5/1984 | Wilkinson ................. | 371/39 |
| 4,497,055 | 1/1985 | Hoshino et al. ................. | 360/38.1 |
| 4,646,301 | 2/1987 | Okamoto et al. ................. | 371/38 X |
| 4,653,051 | 3/1987 | Sugimura et al. ................. | 371/37 |
| 4,653,052 | 3/1987 | Doi et al. ................. | 371/39 |

Primary Examiner—Charles E. Atkinson
Attorney, Agent, or Firm—Lewis H. Eslinger

[57] ABSTRACT

Apparatus for decoding an error detecting or correcting code constructed from digital information data and redundant data for detecting or correcting errors in the digital information data, the digital information data and redundant data being reproduced from a record medium by a playback apparatus that operates in a normal speed mode and fast and slow speed modes, includes a first decoder for decoding the error detecting or correcting code and for generating flag data indicating error conditions of the digital information data, a first memory for storing the digital information data subjected to the decoding in the first decoder, and a second memory for storing flag data. A controller is provided with a mode signal indicating a normal playback mode or a fast playback mode of the record medium playback apparatus for controlling the first and second memories so as to read out the digital information data and flag data, respectively, when the mode signal indicates the normal reproducing mode and so as to read out the digital information data without error and the flag data, respectively, when the mode signal indicates the fast reproducing mode.

8 Claims, 15 Drawing Sheets

Fig. 3
|   | | 1 | 2 | 3 | 4 | 5 | 6 | 7 | 8 | 9 | 10 |
|---|---|---|---|---|---|---|---|---|---|---|---|
|   | 1 | 1 | 2 | 3 | 4 | 5 | 6 | 7 | 8 | 9 | 10 |
|   | 2 | 11 | 12 | 13 | 14 | 15 | 16 | 17 | 18 | 19 | 20 |
| $P_0$ | 31 | 301 | 302 | 303 | 304 | 305 | 306 | 307 | 308 | 309 | 310 |
| $P_1$ | 32 | 311 | 312 | 313 | 314 | 315 | 316 | 317 | 318 | 319 | 320 |
Fig. 4
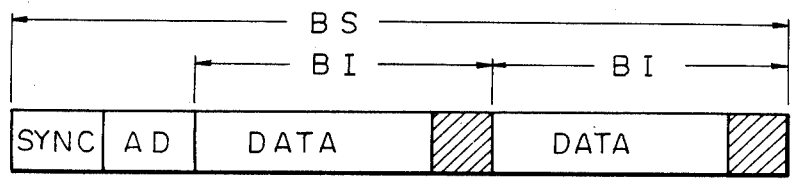
Fig. 5
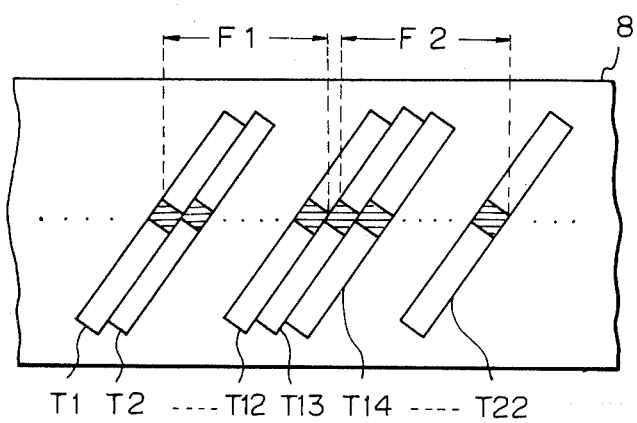

APPARATUS FOR DECODING ERROR CORRECTING CODE

BACKGROUND OF THE INVENTION

1. Field of the Invention

The present invention relates to an apparatus for correcting errors of digital data and, more particularly, to an error correcting apparatus suitable for use in the reproducing section of a digital video tape recorder.

2. Description of the Background

There are now known video tape recorders for digitally recording/reproducing a video signal (hereinafter simply referred to as digital VTR) in which investigations have been made relating to use of the product code as an error correction code that would be effective for correcting burst errors, which are due to signal dropout caused by tape defects or the like. This product code involves manipulation of the data arranged as the inner code in the lateral or horizontal direction and the outer code in the vertical direction for data arranged two-dimensionally. This is, of course, an abstract concept and the data is not physically arranged two dimensionally, only the addresses are based on a two-dimensional array. Inner and outer are used in place of vertical and horizontal because they make the concepts involved easier to visualize.

In the recording system of a digital VTR that uses the product code for error correction, the outer code is encoded with respect to the input digital video signal consisting of data symbols, which are obtained by analog-to-digital (A/D) converting an input analog video signal. Next, the inner code is encoded with regard to the input data symbols and the parity symbols of the outer code.

Further, those symbols are shuffled, and the input digital video signal is recorded on a magnetic tape by rotary heads in the shuffled state. Therefore, each symbol of the digital video data is effectively encoded twice, based on both the outer code and the inner code.

A code that may be used as the outer and inner codes is the Reed-Solomon code, for example, in which two parity symbols are reproduced for every respective error correction code block. With this Reed-Solomon code, a one-symbol error in a code block can be corrected and the two-symbol error can be erasure corrected.

In the reproducing system of a digital VTR, the digital signal reproduced from the magnetic tape by the rotary heads is first decoded by an inner code decoder and, because the time sequence of the reproduced data coincides with the sequence of the data series of the inner code, there is no need to rearrange the data in this decoder of the inner code.

The reproduced data whose errors were corrected by the inner code decoder is then supplied to the rearrangement circuit or shuffling circuit, in which the time sequence of the data is converted into the sequence of the outer code and further decoded by the decoder of the outer code, when in the standard reproducing mode. More specifically, $(m+2)$ symbols at the respective first positions are selected from the respective blocks of the inner codes, which are located in the vertical direction in the inner code blocks, for example, the inner code blocks of $[1, 1], [2, 1], \ldots, [(m+1), 1]$, and $[(m+2), 1]$. These $(m+2)$ symbols are supplied to a syndrome producing circuit of the outer code decoder, so that the syndromes of the blocks of the outer code are produced. In a manner similar to the inner codes, the data is rearranged and $(m+2)$ symbols at the respective last (ith) positions are selected from the respective blocks of the inner codes of $[1, n], [2, n], \ldots, [(m+1), n]$, and $[(m+2), n]$, so that the syndromes of the outer code blocks are produced.

The rearrangement circuit to execute the foregoing data rearrangement comprises a memory that must have a memory capacity that is sufficient to completely store all of the blocks $[n \times (m+2)]$ of the inner codes.

The decoder of the outer code is constituted by the syndrome producing circuit, a correction operation circuit, a data delay circuit, and an error correcting circuit. The syndromes of the outer code, are calculated by the syndrome producing circuit. Two syndromes are produced in the case of using the Reed-Solomon code of two parity symbols in the outer code block, and the sizes of the errors are calculated. An output of the correction operating circuit and the output data of the data delay circuit are supplied to the error correcting circuit. The resultant error is modulo-2 added at the position of the error symbol in the reproduced data from the data delay circuit, and the requisite error correction is carried out. The data delay circuit is used for phase matching between the output of the correction operating circuit and the reproduced data and provides the delay amount of $(m+2)$ symbols.

Thus, the digital data output, which was respectively subjected to the error correcting processes using the inner code and outer code, is obtained from the decoder of the outer code.

In the variable speed reproducing mode, such as the high-speed reproducing mode, low-speed reproducing mode, still mode, or the like, the angle of inclination of the tracks formed on the magnetic tape does not coincide with the angle of inclination of the scan track of the rotary heads, so that the data is intermittently reproduced. Therefore, all of the data that forms the code block of the outer code can not be obtained in these nonstandard reproduction modes. Thus, in such known systems the data is transferred by bypassing the decoder of the outer code and the outer code is not decoded. Only that data, which was determined to have no error, based only on the inner code is written into a buffer memory having a large capacity, for example, a memory capacity large enough to store the digital data of three complete fields.

The data writing operation into the buffer memory is executed in accordance with the block addresses added for every two inner code blocks, and the data of the same field that is among the data that was intermittently stored is collectively outputted from the buffer memory.

The output data read out from the buffer memory is then supplied to the rearranging or deshuffling circuit, in order to return the sequence of the data series to the original sequence. More specifically, the deshuffling circuit performs data rearrangement exactly opposite to that of the shuffling circuit provided in the recording circuit. By recording the data in the shuffled state and then deshuffling the data upon reproduction the concentration of errors to one location is prevented. The memory capacity of the deshuffling circuit is determined in correspondence to the length of unit of the shuffling that was performed.

The output of the deshuffling circuit is supplied to an error concealment circuit to conceal errors that can not be corrected. The error concealment circuit interpolate the erroneous sampling data by using the correct sampling data located around this error sampling data. An output of the error concealment circuit is supplied to a digital-to-analog (D/A) converter and the reproduced analog video signal is obtained from its output terminal.

The above-mentioned conventional apparatus for decoding the error correction code has several drawbacks, one of which is that a memory having an extremely large capacity is needed for the rearrangement from the inner code sequence to the outer code sequence in the outer code decoder. In addition, a memory of capacity corresponding to the unit length of the shuffling operation is also necessary in the deshuffling circuit.

In the slow-motion reproducing operation, in particular in the variable speed reproducing operations, the data of one complete unit of the product code is not quite reproduced for the interval of a plurality of fields. However, the conventional decoding apparatus cannot decode the outer code in such a slow-motion reproducing operation.

Furthermore, since intermittent data is reproduced in the variable speed reproducing mode, in the case where the current reproduced data is written into the buffer memory and this data is then read out, the data which has already been read out frequently remains in the buffer memory without being updated, and such old data causes the reproduced picture quality to deteriorate.

To avoid this problem, a flag memory is provided with the same address as that supplied to the buffer memory and after the data has been read out from the buffer memory, an error flag indicative of old data is immediately written into the address of the flag memory read out. This error flag is used to distinguish the reproduced new-data (New) from the reproduced old-data (Old) and referred to as a New/Old (N/O) flag. Among the data read out from the buffer memory, the data that has been determined to be the old-data (Old) by the N/O flag is concealed by the error concealment circuit in the following stage.

On the other hand, even when considering such a system in which a buffer memory is arranged between the decoder of the inner code and the decoder of the outer code there is also at least the following drawback. As in the conventional apparatus, if writing data into the buffer memory is inhibited when the error data remains, as the result of the decoding of the inner code, even in the case where only a part of the data in the code block of the inner code is error data, the whole code block is not written, so that the error correcting capability of the outer code cannot be sufficiently used.

In the digital VTR of the segment system, for example, assuming that the reproducing speed of the tape is ½ of the recording speed of the tape, a period of time which is twice as long as the ordinary reproducing mode is required to reproduce the video data of one field. The time period for writing the data into a field memory of the buffer memory is also twice as long as that in the ordinary writing mode. Therefore, it is impossible to read out and use the video data from this field memory, so the old data of one field that was written in the other field memory is read out twice. In this manner, in the case of repeatedly reading out the data from the buffer memory for two fields, the conventional N/O flag indicates that all of the readout data is the old data with respect to the video data read out the second time. Consequently, all of the video data of one field read out at the second time must be error corrected. Such error correction is obviously impossible, and the conventional method of forming the N/O flag is very inconvenient in the slow motion reproducing operation of the digital VTR.

OBJECTS AND SUMMARY OF THE INVENTION

Accordingly, it is an object of the present invention to provide apparatus for decoding an error correction code that can eliminate the above-mentioned defects inherent in known systems.

Another object of the invention is to provide apparatus for decoding an error correction code, in which the memory capacity is reduced and the scale of the hardware is reduced relative to systems known heretofore.

A further object of this invention is to provide an apparatus for decoding an error correction code, in which the correcting capability of the error correction code can be effectively used.

A still further object of this invention is to provide apparatus for decoding an error correction code, in which the correction capability of the outer code in the product code can be effectively used, and the error correcting capability can be improved.

Still another object of this invention is to provide apparatus for decoding an error correction code, in which the error correcting capability can be effectively used and the error correcting capability can be improved in the ordinary reproducing mode or variable speed reproducing mode.

Another object of this invention is to provide apparatus for decoding an error correction code, in which the error correcting capability can be effectively used, particularly, in the slow motion reproducing mode.

Still another object of the invention is to provide apparatus for decoding an error correction code, in which the outer code can be decoded, particularly, in the slow motion reproducing mode.

In accordance with an aspect of the present invention, there is provided apparatus for decoding an error correction code which is constructed from digital information data and redundant data for detecting or correcting errors in the digital information data, the digital information data and redundant data being reproduced from a record medium by a playback apparatus that can operate at a normal playback speed and at varied playback speeds, such as fast or slow. This apparatus comprises an input circuit for receiving the digital information data and the redundant data, a first decoder for decoding the error detecting or correcting code and for generating flag data indicating error conditions of the digital information data, a first memory for storing the digital information data subjected to the decoding in the first decoder, a second memory for storing the flag data, and a control system provided with a mode signal indicating a normal reproducing mode or a fast reproducing mode of the record medium playback apparatus for controlling the first and second memories so as to have written therein the digital information data and the flag data, respectively, when the mode signal indicates the normal reproducing mode and so as to have written therein the digital information data without error and the flag data, respectively, when the mode signal indicates the fast reproducing mode, for example.

In addition, the error detecting or correcting code constructed from the digital information data is, arranged in a matrix form, such that first redundant data forms a first error detecting or correcting code for detecting or correcting errors of a first series of the digital information data in a first direction of the matrix, second redundant data forms a second error detecting or correcting code for detecting or correcting errors of a second series of the digital information data in a second direction of the matrix, the digital information data, first redundant data and second redundant data are reproduced from the record medium by the record medium playback apparatus, the first decoding means decodes the second error detecting or correcting code, and the first memory means stores the digital information data and first redundant data subjected to the decoding in the first decoding means for outputting the digital information data and first redundant data arranged in the first series of the first error detecting or correcting code. A second decoder is also provided with the digital information data and first redundant data from the first memory for decoding the first error detecting or correcting code.

The above and other objects, features and advantages of the present invention will become apparent from the following detailed description of illustrative embodiments thereof to be read in conjunction with the accompanying drawings.

BRIEF DESCRIPTION OF THE DRAWINGS

FIG. 3 is a representation of a format of an error correction code used in a digital VTR to which apparatus for decoding an error correction code according to this invention is applicable;

FIG. 4 is a representation of the format of the recorded data in a digital VTR to which apparatus for decoding an error correction code according to this invention is applicable;

FIG. 5 is a representation showing the track pattern in a digital VTR to which apparatus for decoding an error correction code according to this invention is applicable;

DESCRIPTION OF THE PREFERRED EMBODIMENTS

Figure 1:
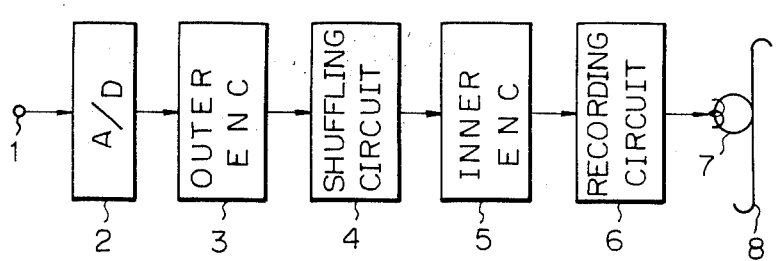
FIG. 1 is schematic in block diagram form of a recording apparatus of a digital VTR to which apparatus for decoding an error correction code according to the present invention is applicable.

In FIG. 1 an analog video signal is supplied from an input terminal 1 to an analog-to-digital (A/D) converter 2 that forms a digital video signal in which one sample is digitized to a word or sample of eight bits. This digital video signal is then supplied to an outer code encoder 3. The outer code selected to encode the digital video signal in outer code encoder 3 may be, for example, the (m+2, n) Reed-Solomon code.

The encoded digital video data from the outer code encoder 3 and the parity symbols of the outer code are supplied to a shuffling circuit 4. Shuffling circuit 4 serves to change the sequence of the digital video data and thereby to prevent the concentration of errors, even when a number of errors are caused, such as in the variable speed reproducing modes. The output data of shuffling circuit 4 is then supplied to an inner code encoder 5. The inner code, selected to encode the shuffled digital video signal in inner code encoder 5, may be for example, the (i+2, i) Reed-Solomon code.

The data output from the encoder 5 is supplied to a recording signal output unit 6, which includes a parallel-to-serial (P/S) converter, a recording amplifier, and the like. A recording signal from the output of recording unit 6 is fed to rotary heads 7 through a rotary transformer (not shown) and the encoded and shuffled digital video signal is recorded on a magnetic tape 8.

Figure 2:
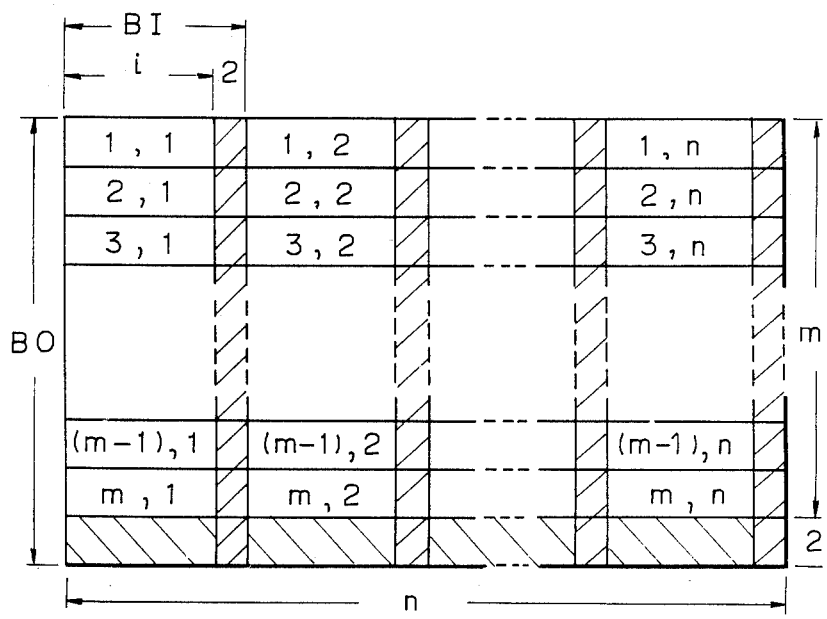
FIG. 2 is a representation of a format of an error correction code used in a digital VTR to which apparatus for decoding an error correction code according to this invention is applicable.

In this embodiment, the product code as shown in FIG. 2 which has already been proposed is used as the foregoing error correction code. More specifically, the outer code is encoded for every m continuous symbols (samples) of the digital video data, each consisting of eight bits, and two parity symbols are produced. A code block of the outer code (BO) is formed by (m+2) symbols and i code blocks BO of the outer code are arranged in the column direction. The inner code is encoded with respect to i symbols which cross a plurality of code blocks BO of the outer code, and n inner code blocks (BI) each consisting of (i+2) symbols are arranged in the lateral direction. Thus, a unit of the product code is constituted by [(m+2)s×n] inner code blocks BI.

FIG. 3 represents a practical constitution of the product code described in general in FIG. 2, which is applied to the digital VTR for recording/reproducing the component color video data of the (4, 2, 2) system, that is, a component system in which the sampling frequency of the luminance data Y is twice as high as the sampling frequency of each of the color difference data U and V. The block numbers in FIG. 3 denote the numbers of the inner code blocks BI, and this block of product code is composed of a total of 320 inner code blocks BI, of which ten inner code blocks BI are arranged in the lateral direction and thirty-two inner code blocks BI are arranged in the vertical direction.

One inner code block BI consists of sixty sampling data and parities of the Reed-Solomon code of either four or six samples, and one outer code block BO is composed of thirty sampling data and two parities of the Reed-Solomon code. As shown in FIG. 4, a synchronizing signal SYNC and an address AD are added in the head of two inner code blocks BI. In FIG. 4, the hatched portions indicate the parities. In this fashion, one synchronizing block BS is constituted.

FIG. 5 shows a track pattern consisting of tracks $T_1$, $T_2, \ldots, T_{22}$ formed on magnetic tape 8 by rotary heads 7, which are configured as two sets, formed of a pair of rotary heads A and B and another pair of rotary heads C and D. These sets are respectively arranged at an angular separation of 180°. In this example, the digital audio signal is recorded in the central portion (hatched region) of each of the tracks $T_1$ to $T_{22}$. Every two of the tracks $T_1$ to $T_{22}$ are formed in parallel in a single scan of the rotary heads. The color video data of fifty horizontal intervals (50 H) is recorded in the portion of a track that is formed by the latter half interval of the single scan of one pair of rotary heads A and B and the former half interval of the single scan of another pair of rotary heads C and D. Thus, in the data of 50 H, the block of the product code shown in FIG. 2 is formed from the data that is recorded/reproduced by one rotary head.

The video data of the field $F_1$ is recorded in ten tracks from the latter half portion of tracks $T_1$ and $T_2$ to the former half portion of tracks $T_{11}$ and $T_{12}$. The video data of the next field $F_2$ is recorded in the ten tracks from the latter half portion of tracks $T_{11}$ and $T_{12}$ to the former half portion of tracks $T_{21}$ and $T_{22}$. Note that when a video frame equals approximately 525 lines, 50 H corresponds roughly to 1/5 of a field.

Because the luminance data Y of 720 samples and the color difference data of U and V, each consisting of 360 samples, are included in one horizontal interval 1 H, the number of samples of one 50 H segment of the data, which is recorded and reproduced by one rotary head, becomes $$720 \times 2 \times 50 \times \tfrac{1}{4} = 18,000 \; (samples)$$

Further, assuming that a set of four samples of two luminance data $Y_1$ and $Y_2$ and the color difference data U and V comprise one sample group, the size of one unit of the block of the product code is constituted by arranging 32 sample groups in the vertical direction and 150 sample groups in the lateral direction, which results in a total of 4800 sample groups consisting of the parity data of 300 sample groups and the data of 4500 sample groups, in which one segment is reduced to $\tfrac{1}{4}$.

Figure 6:
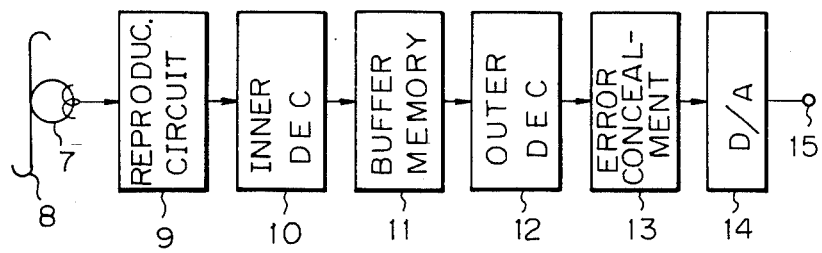
FIG. 6 is a schematic in block diagram form of a reproducing apparatus in a digital VTR to which apparatus for decoding an error correction code according to this invention is applicable.

A reproducing circuit is constituted as shown in FIG. 6, in which the signal reproduced from magnetic tape 8 by rotary heads 7 is supplied to an input reproducing unit 9 through a rotary transformer (not shown). Input reproducing unit 9 includes a PLL circuit to reproduce a clock synchronized with the reproduced data, a serial-to-parallel (S/P) converter, a block sync detecting circuit, an address reproducing circuit, and the like. The time sequence of the reproduced data corresponds to the time sequence of the inner code and by supplying the reproduced data to an inner code decoder 10, the inner code is decoded. Inner code decoder 10 executes the error correction according to the (i+2, i) Reed-Solomon code and also detects residual errors.

The output data of inner code decoder 10 is supplied to a buffer memory 11 that is composed of, for example, a data buffer memory having a capacity large enough to store the data and a flag memory to store error information, as will be explained in detail hereinbelow. A one-bit error flag associated with the decoded output data of inner code decoder 11 is stored in the flag memory. This error flag can be added by various methods, for example, in the ordinary reproducing mode and slow-motion reproducing mode the data that is regarded as the error data on the basis of the result of the decoding by the inner code decoder 10 is stored in the data buffer memory and, at the same time, the error flag associated with this data can be stored in the flag memory. On the other hand, in the high-speed reproducing mode the data that was determined to be error data by inner code decoder 10 is not written into the data buffer memory, and when the preceding data of the same address is read out, the flag representative of the reproduced old-data is set into the flag memory as the New/Old (N/O) flag to distinguish the reproduced new-data from the reproduced old-data. As another example, in both the standard reproducing and slow-motion reproducing modes the data that was decided to be error data by inner code decoder 10 is not written into the data buffer memory, and the N/O flag of the old-data is set into the flag memory.

The reproduced video data and error flag that are outputted from buffer memory 11 are supplied to the outer code decoder 12, which executes the decoding according to the (m+2, m) Reed-Solomon code. The time sequence of the output data from buffer memory 11 is the outer code sequence. Therefore, there is no need to provide a further memory to convert the inner code sequence into the outer code sequence for use in outer code decoder 12. In decoder 12 the error flag including the N/O flag read out of buffer memory 11 is handled as error data, and the ordinary error correction to correct one-symbol error in the block BO of one outer code or the pointer erasure correction using the error flag is performed.

The output data of outer code decoder 12 is supplied to an error concealment circuit 13, which interpolates the error data that cannot be corrected by the decoder 12. The output data from error concealment circuit 13 is taken out at an output terminal 15 through a digital-to-analog (D/A) converter 14. In the high-speed reproducing mode, in which the speed of the magnetic tape 8 is faster than that during recording, the data constituting a complete outer code block is not quite obtained, so that only the decoding of the inner code is performed and the decoding of the outer code is not executed. In this case, the error concealment is performed by only error concealment circuit 13.

Figure 7:
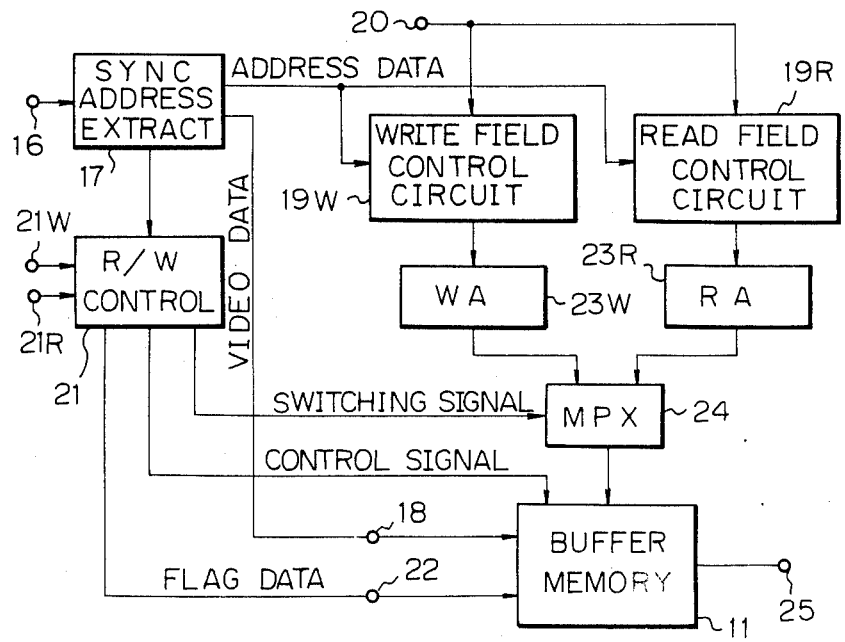
FIG. 7 is a schematic in block diagram form showing in detail an embodiment of a buffer memory provided in the reproducing apparatus in the digital VTR of FIG. 6.

In FIG. 7, the operating system of buffer memory 11 is shown, in which the output data of inner code decoder 10 is fed in at an input terminal 16 and supplied to a sync signal and address extracting circuit 17. As shown in FIG. 4, the sync signal and address data, which were added for every two inner code blocks BI and which were again added when the decoded data is outputted from the inner code decoder, are separated by extracting circuit 17. The input data from which the sync signal and address were removed is supplied to the memory 11 through an input terminal 18. The memory 11 has a capacity of, for example, three fields. The separated address data is supplied to a write field control circuit 19W and a read field control circuit 19R, and the write field and read field in the buffer memory are determined by the control circuits 19W and 19R, respectively. A reproducing mode signal indicative of any one of the standard reproducing and high-speed reproducing modes is supplied at input terminal 20 the write and read field control circuits.

Error correction of the data in the inner code block BI is performed by decoder 10 and the error data with respect to the data is formed and supplied to a read/write (R/W) control circuit 21. A write clock is input to a terminal 21W and a read clock is input to a terminal 21R and both are supplied to R/W control circuit 21, which generates control signals such as a write enable signal and the like, to control the reading/writing operations from and into buffer memory 11. R/W control circuit 21 also generates a read/write (R/W) switching signal and flag data. R/W control circuit 21 writes the flag data into buffer memory 11 through input terminal 22, and control signals, such as the write enable signal and the like, are also supplied to buffer memory 11. The R/W switching signal is supplied to a multiplexer 24 for switching outputs of a write address (WA) generating circuit 23W and a read address (RA) generating circuit 23R. The write address or read address selected by the multiplexer (MPX) 24 becomes the address input of buffer memory 11. The data sequence read out of buffer memory 11 is fed out at an output terminal 25.

The write address is determined on the basis of the address data separated from the input data sequence and when either the address data or the data is error data, for instance, this error data is not written into buffer memory 11. The read address is such as to form the outer code sequence and, at the same time, the deshuffling is executed under the control of the write address or read address.

Figure 8:
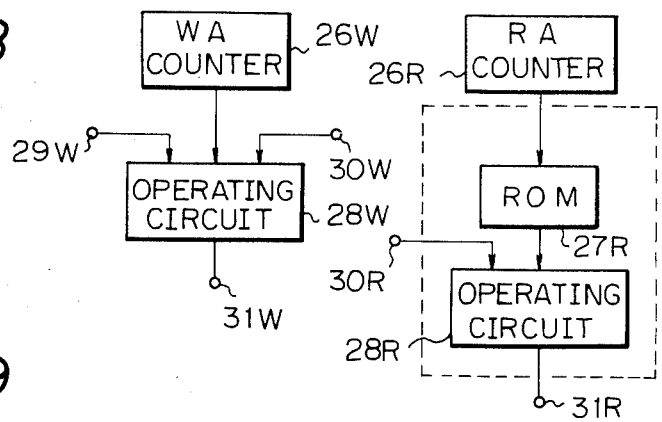
FIG. 8 is a schematic in block diagram form of an embodiment of an address generating circuit of the buffer memory shown in FIG. 7.
Figure 9:
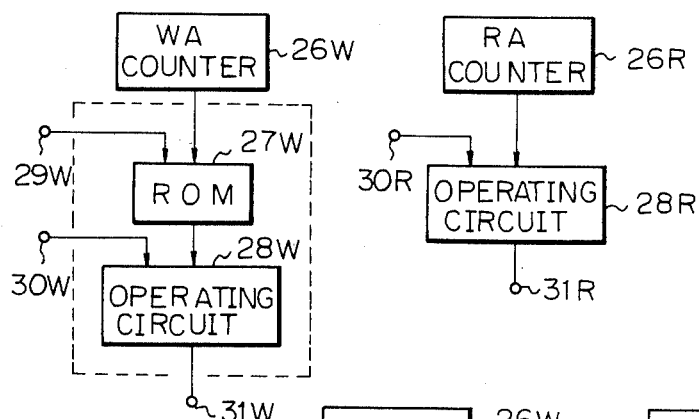
FIG. 9 is a schematic in block diagram form of an embodiment of an address generating circuit of the buffer memory shown in FIG. 7.
Figure 10:
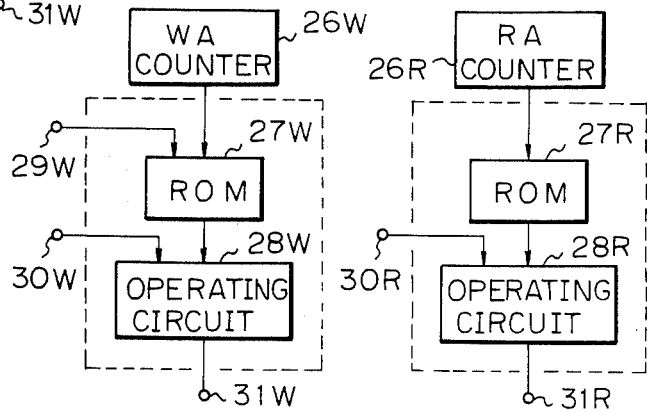
FIG. 10 is a schematic in block diagram form of an embodiment of an address generating circuit of the buffer memory shown in FIG. 7.

Some examples of the constitutions of the conversion into the outer code sequence and the address control of buffer memory 11 for deshuffling are shown in FIGS. 8 to 10, which illustrate various embodiments of the write address generating circuit 23W and read address generating circuit 23R shown generally in FIG. 7.

The address generating circuit shown in the embodiment of FIG. 8 controls only the read address, and the write address (WA) generating circuit consists of a write address (WA) counter 26W and an operaing circuit 28W. The WA counter 26W generates the write address only the number of times necessary for one sync block. The write address, the address of the sync block (hereinafter referred to as the sync address) at terminal 29W, and the field number and segment number data from a terminal 30W are supplied to an operating circuit 28W. The write address is obtained from operating circuit 28W at an output terminal 31W. When the buffer memory 11 has sufficient memory capacity, it is sufficient for the operating circuit 28W to merely synthesize the input address data as the output address. The write address serves to write the reproduced data into the buffer memory 11 on the basis of the reproduced address data.

The readout side is constituted by a read address (RA) counter 26R, a read only memory (ROM) 27R, and an operating circuit 28R. The RA counter 26R generates the read address in the field (or frame). ROM 27R converts the output address of RA counter 26R into the address for the conversion into the outer code sequence and for the deshuffling. The output of ROM 27R, and the read field number data fed in at a terminal 30R, are supplied to the operating circuit 28R. The read address formed by the operating circuit 28R is available at an output terminal 31R. It should be noted that a read only memory having a large capacity can be substituted for the arrangement consisting of ROM 27R and operating circuit 28R surrounded by the broken line.

The address generating circuit shown in FIG. 9 controls only the write address. More specifically, the output of the WA counter 26W and the sync address fed in at terminal 29W are supplied to a ROM 27W for deshuffling. An output of ROM 27W and the field number and segment number data fed in at terminal 30W are supplied to operating circuit 28W. The write address is obtained from the operating circuit 28W and fed out at output terminal 31W. Once again, a read only memory having a large memory capacity could be substituted for the arrangement consisting of ROM 27W and operating circuit 28W surrounded by the broken line.

On the other hand, in the circuit of FIG. 9 the readout side is composed of read address counter 26R and operating circuit 28R, which receives the output of the RA counter 26R and the field number data fed in at terminal 30R, and generates the read address available at output terminal 31R.

FIG. 10 shows an address generating circuit that controls both the write address and the read address. This embodiment need not be explained in detail, because in the embodiment of FIG. 9, ROM 27W is provided on the write side and ROM 27R is provided on the readout side. Thus, the address conversion which is executed by one ROM is distributively executed by the ROMs 27W and 27R.

Figure 11:
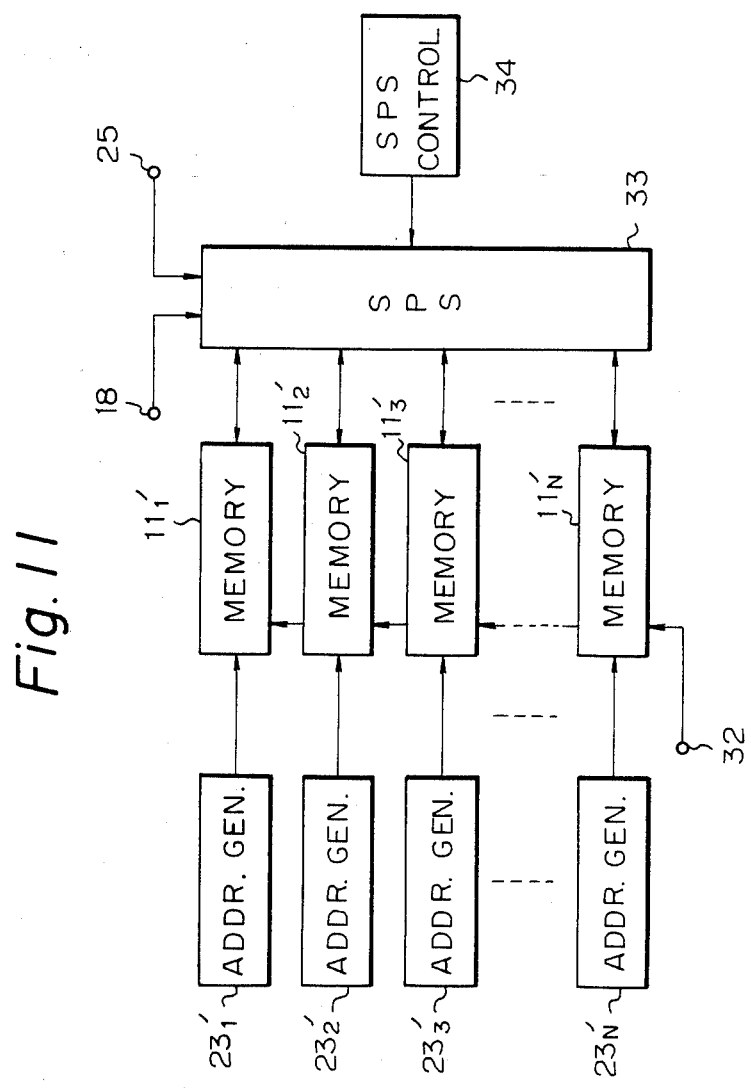
FIG. 11 is a schematic in block diagram form of another embodiment of a buffer memory provided in the reproducing apparatus in the digital VTR of FIG. 6.

When the processing speed of buffer memory 11 is lower than the data rate, the memory needs to be made operative in parallel. FIG. 11 shows an arrangement of buffer memory 11 suitable for performing parallel operations, in which memory 11 is divided into N parallel channels. More specifically, buffer memory 11 is divided into N parallel channels composed of N memory chips $11_1'$ to $11_N'$ and N address generating circuits $23_1'$ to $23_N'$ are provided for the memory chips $11_1'$ to $11_N'$, respectively. The memory control signals, such as the write enable signal and the like, are supplied in common from an input terminal 32 to memory chips $11_1'$ to $11_N'$.

The respective input data of memory chips $11_1'$ to $11_N'$ are supplied from a serial ←→parallel (SPS) converter 33. The SPS converter 33 is controlled by a control circuit 34 and converts the reproduced serial data fed in at terminal 18 into parallel data, thereby reducing the data rate to 1/N. The respective output data of the memory chips $11_1'$ to $11_N'$ are supplied back to SPS converter 33, wherein they are converted back into the serial data. Thus, the deshuffled output data which was converted into the outer code sequence is made available at the output terminal 25.

In the case of handling color video data, it is generally necessary to use a buffer memory having a parallel processor circuit arrangement, as shown in FIG. 11. In terms of the data rate, however, the parallel constitution generally needs a plurality of address generating circuits $23_1'$ to $23_N'$, so that the control of these address generating circuits becomes complicated. The problems which are caused when such a constitution for the parallel operations of the memory is used, and the methods that can solve the problems, are described hereinbelow.

In order to aid the understanding of the shuffling and deshuffling operations, an explanation is set forth with reference to FIG. 12, with regard to how the data is input into and read out from the buffer memory of shuffling circuit 4 during the recording operation.

Figure 12:
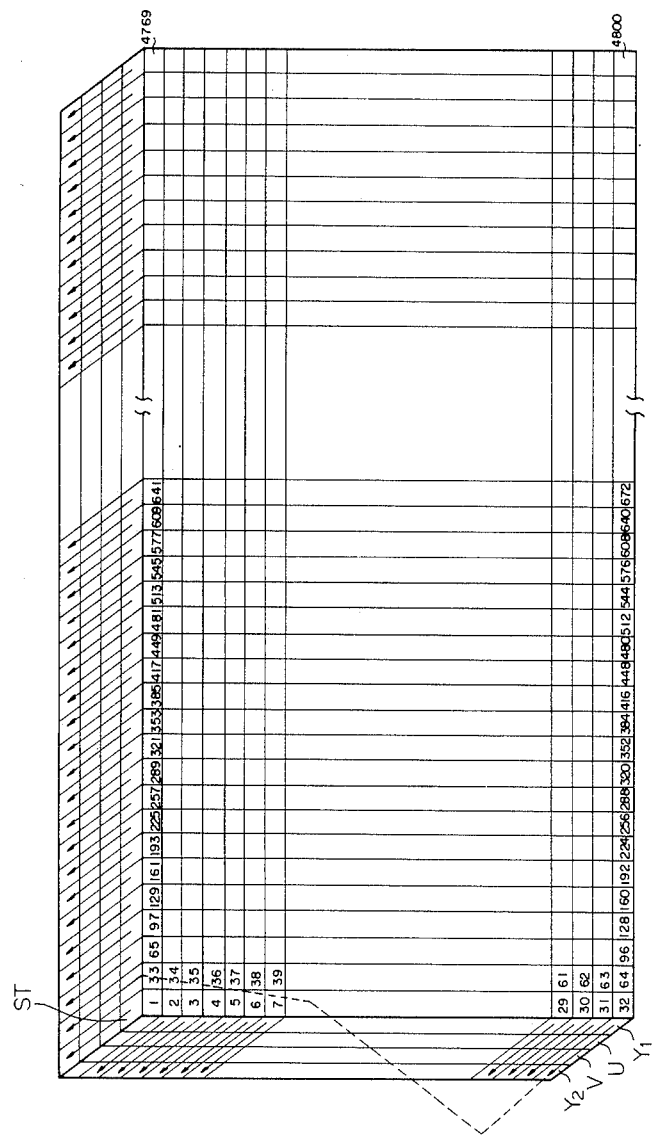
FIG. 12 is a three-dimensional representation useful for explaining the input sequence of video data into the buffer memory provided in the recording apparatus in the digital VTR of FIG. 6.

The 4800 sample groups that are recorded by one rotary head are shown in FIG. 12 in accordance with the input sequence. In one sample group, as represented in three-dimensions in FIG. 12, one luminance data $Y_1$ is arranged at the lowermost front position, and the color difference data U and V and the other luminance data $Y_2$ are sequentially arranged proceeding in the depth direction. Alternatively, these data can be arranged in accordance with the sequence U, $Y_1$, V, and $Y_2$.

In FIG. 12, the data is sequentially written into the buffer memory as indicated by the arrows from the start point ST which coincides with the sampling data at the left end at the frontmost position of the first sample group. More specifically, the data is sequentially written into the buffer memory from the first sample group, the second sample group, the third sample group, . . . , until the data of the last 4800th sample group is finally written into the buffer memory. Upon completing the writing operation into the buffer memory, the shuffling operation may be also executed with respect to the direction of the outer code sequence.

The reading operation of the data from the buffer memory of the shuffling circuit 4 is described with reference to FIG. 13, because it is in this reading operation that the shuffling process is carried out.

Figure 13:
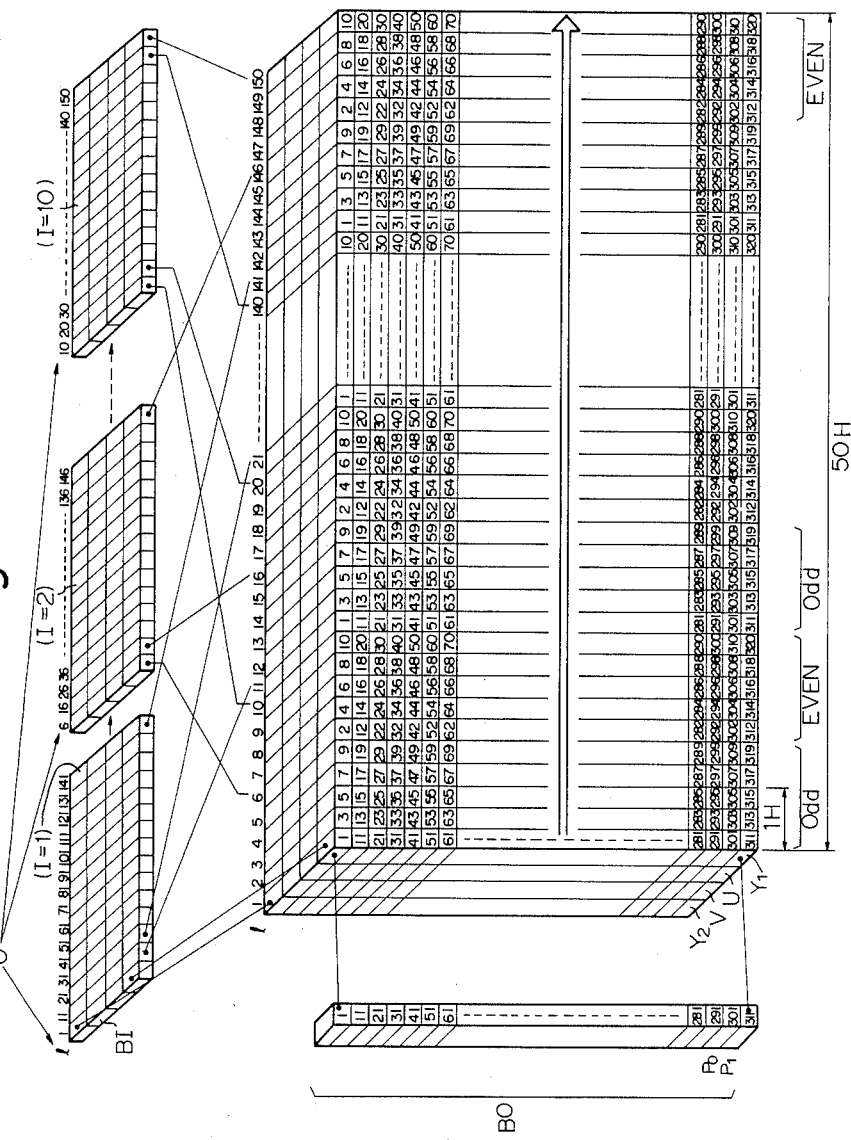
FIG. 13 is a three-dimensional representation useful for explaining in more detail the input sequence of video data into the buffer memory.

FIG. 13 shows the recording sequence of the input data, in which (l=1, 2, . . . , 150) indicates the numbers of the columns for every four outer code blocks with regard to $Y_1$, U, V, and $Y_2$. The number added for each sample group denotes the number I of the inner code block into which the sample group is written. In the shuffling process, 150 sample groups located along every line in FIG. 13 are rearranged to form ten inner code blocks, each consisting of fifteen sample groups. The shuffling process based on the same rule is performed with respect to each row and, from the sampling data shown in FIG. 12, a total of 320 inner code blocks BI of (I=1 to 320) are formed, as shown in FIG. 3.

In this shuffling process, with respect to l, a total of fifteen sample groups, which are arranged at regular intervals of every ten sample groups from the oth sample group as the start sample group, are selected. Namely, the oth, (o+10)th, (o+20)th, (o+30)th, - - -, (o+130)th, and (o+140)th sample groups are selected. The selected sample groups are supplied to inner code encoder 5 and one inner code block is formed. For instance, with respect to the first sample group, the sample groups of the numbers (o=1, 6, 2, 7, 3, 8, 4, 9, 5, 10) with regard to the number 1 become the respective first sample groups of (I=1 to 10) of the inner code blocks.

The data is recorded in accordance with the sequence from (I=1) of the inner code block to (I=2), (I =3), . . . , (I=320) and every adjacent two blocks constitute the sync block, and the data of (4×15×2=120 samples) is included in the sync block. In FIG. 13, the example in which one outer code block BO was separated is illustrated. As shown in this example, the outer code block BO is formed for every 32 samples arranged in the vertical direction.

Figure 14:
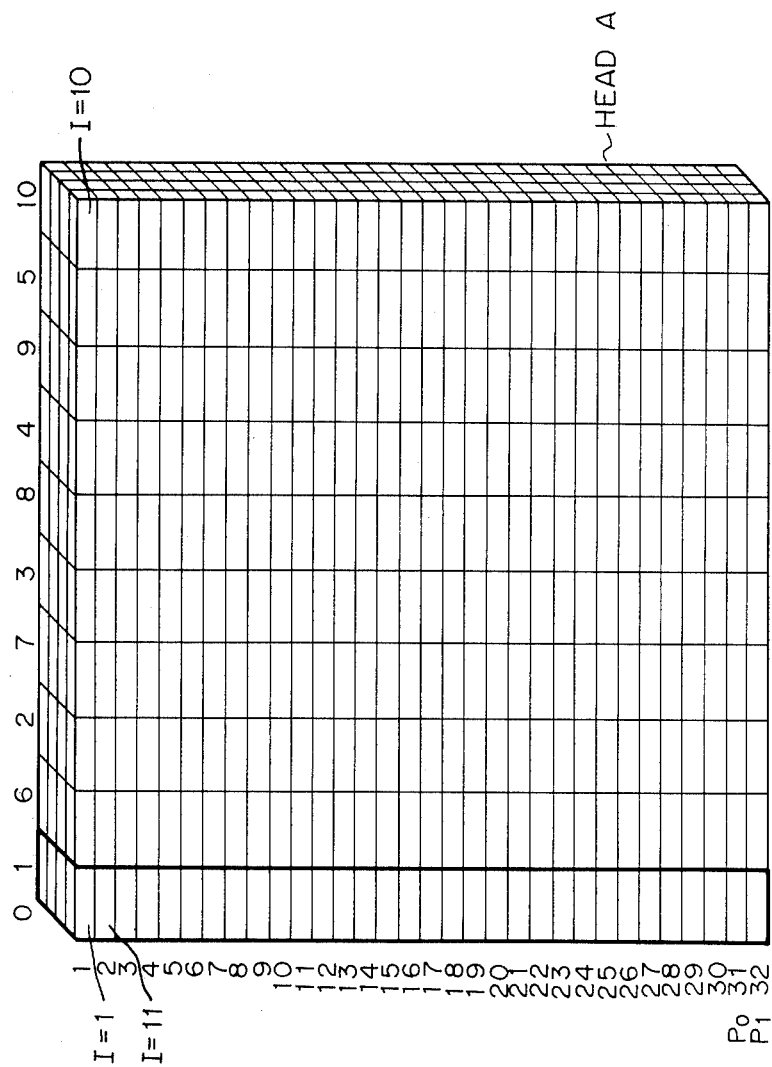
FIG. 14 is a three-dimensional representation useful for explaining in more detail the input sequence of video data into the buffer memory.

FIG. 14 shows the data arrangement in FIG. 13 with regard to rotary head A, and, since the data arrangements of the other three rotary heads B, C, and D are similar to that of FIG. 13, they are not shown therein. In FIG. 14, the numbers o of the first sample groups indicating the reading sequence as the inner code block are shown in the lateral direction. More specifically, FIG. 14 shows the composition of the data arranged in accordance with the sequence of the inner code block numbers, that is, the sequence as it appears after completion of the shuffling process. The data of 4800 sample groups included in the data arrangement is recorded in accordance with the sequence of [($Y_1$→U→V→$Y_2$) of each of fifteen sample groups of (I=1)→[($Y_1$→U→V→$Y_2$) of each of fifteen sample groups of (I=2)]. A pair of rotary heads A and B and a pair of rotary heads C and D record the parallel data, respectively.

Figure 15:
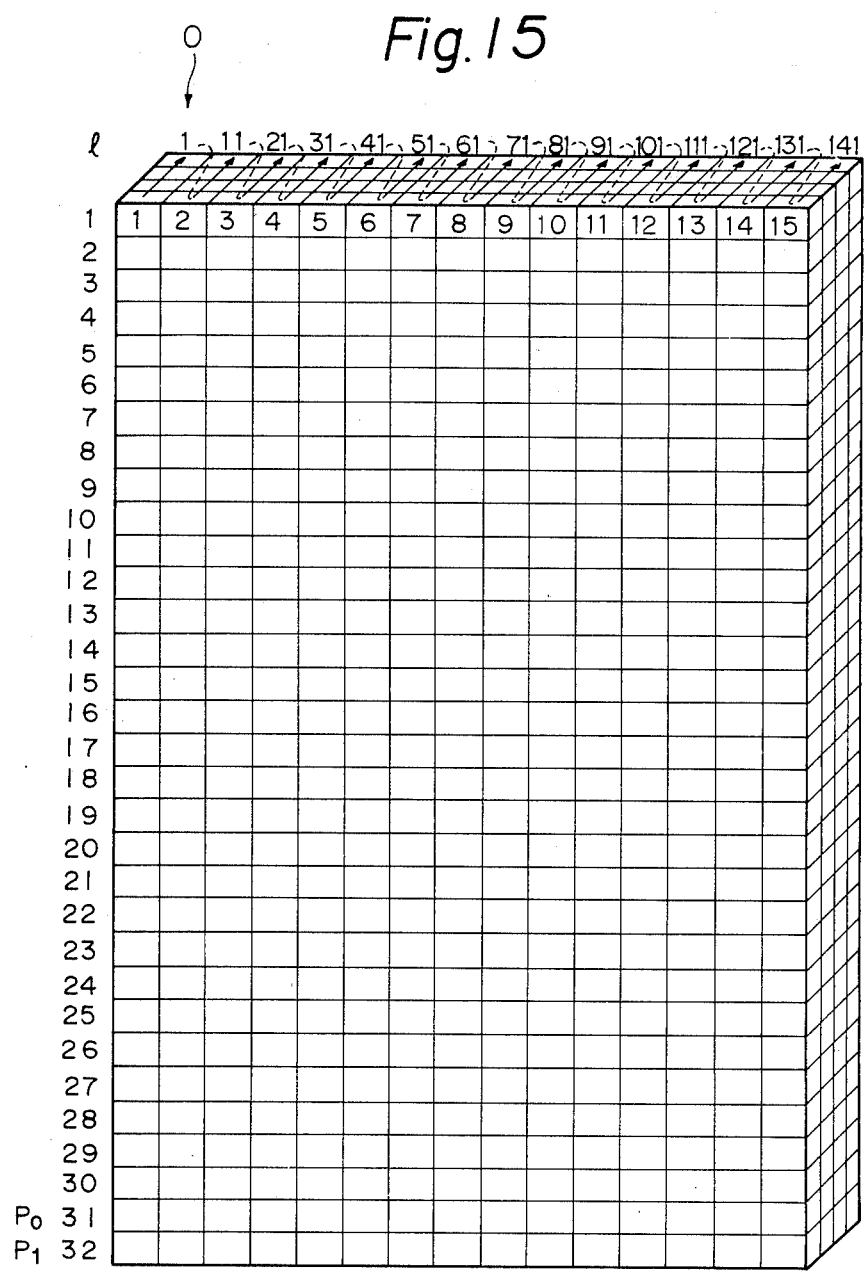
FIG. 15 is a three-dimensional representation useful for explaining in more detail the input sequence of video data into the buffer memory.

FIG. 15 shows an enlarged diagram of the portion surrounded by the heavy solid line on the leftmost side in FIG. 14, which shows the portion in which a total of thirty-two inner code blocks of (I=1, 11, 21 ---, 311) were piled. In FIG. 15, the sampling data of the inner code block of (I=1) is recorded in accordance with the sequence indicated by the arrows.

In buffer memory 11 of the reproducing circuit, a deshuffling process opposite to the shuffling process is executed each time the reproduced data is output from each rotary head. When buffer memory 11 has the parallel processing embodiment using the SPS converter 33, as shown in FIG. 11, the data cannot be simultaneously read out in parallel from the same memory chip. Therefore, if the data is not distributed into the respective memory chips upon writing, there will be caused an inconvenience such that the inner code sequence cannot be converted into the outer code sequence. The writing process in the embodiment where the parallel number N of buffer memory 11 is six will be described hereinbelow.

Figure 16:
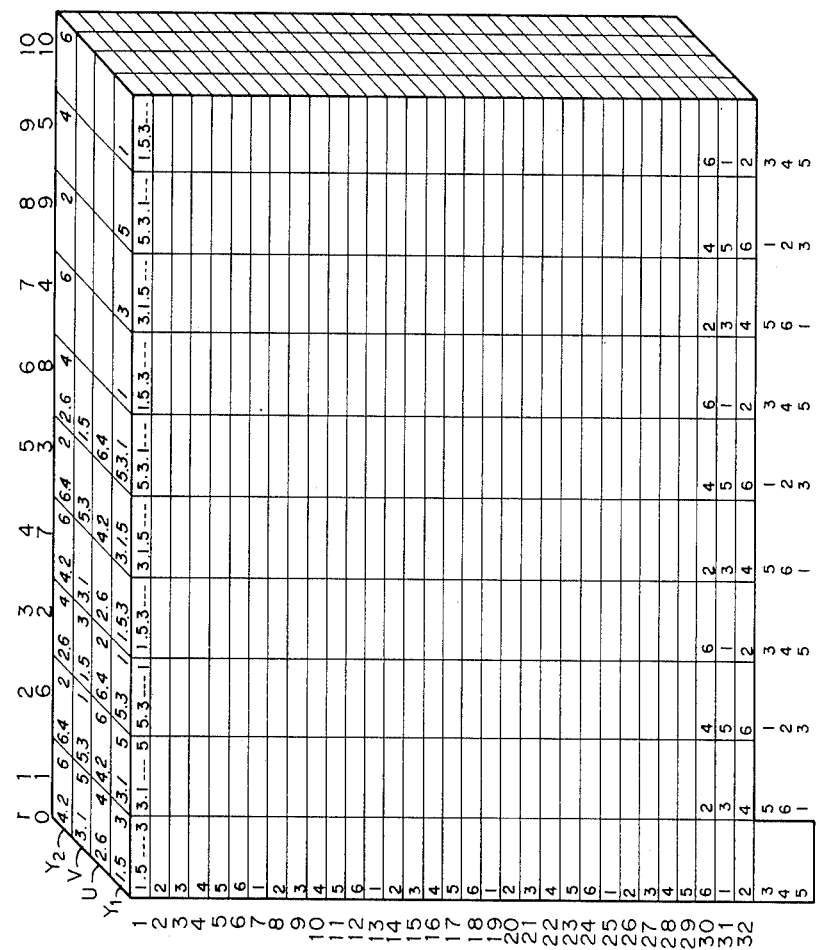
FIG. 16 is a three-dimensional representation useful for explaining the writing and reading operations into and from the buffer memory.

The writing operation into six memory chips is carried out in principle in accordance with the data reproducing sequence based on the inner code block numbers I, that is, the numbers r in FIG. 16. However, because the sampling data equal to the integer times the number of memory chips is included in the inner code block, if the reproduced data is merely converted into the parallel data on a six-sample unit basis and written into the six memory chips, the number of chips into which the head sampling data $Y_1$ of each inner code block is written will always be 1. In addition, the data of the same chip number is included in the vertical direction as well. Thus, the deshuffling process cannot be performed.

To prevent this, as represented in FIG. 16, the sampling data of the block number (I=1) is sequentially distributed into six memory chips and in the case where the data of the next inner code block is written, two chip numbers are skipped and the chip number of the sampling data of the head luminance data $Y_1$ of the inner code block of (I =2) is set to 3. In a manner similar to the above, the above control procedure is likewise executed with respect to the inner code blocks (I=1 to 10) of the first row. With regard to the inner code block (I=11 to 20) of the second row, the chip number of the sampling data of the head luminance data $Y_1$ of the inner code block (I=11) is set to 2 and a process similar to the above is also performed with respect to the inner code blocks of (I=12 and subsequent numbers).

The chip numbers of the head sampling data $Y_1$ of the inner code blocks, which are arranged at the leftmost positions of the 3rd, 4th, ..., 32nd rows, are set so as to have the cyclic, numbers of the sequence (1, 2, 3, ..., 6). In other words, when the data is written into each memory chip of buffer memory 11, one chip number is skipped in response to the change to the next row.

Figure 17:
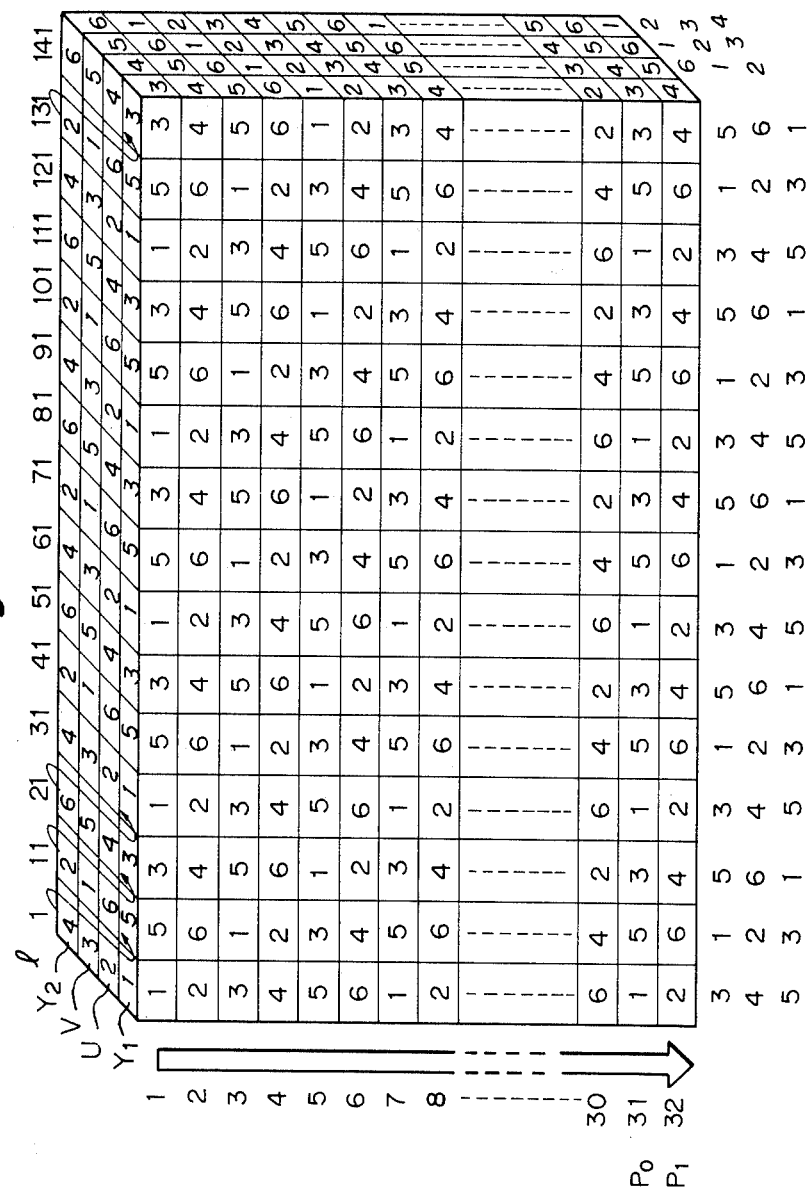
FIG. 17 is a three-dimensional representation useful for explaining the writing and reading operations into and from the buffer memory.

FIG. 17 shows a set of thirty-two inner code blocks on the leftmost side in FIG. 16 as a unit of the sample group. As will be understood from FIGS. 16 and 17, because each column in the vertical direction is constituted by a set of chip numbers (1, 2, 3, ..., 6), when the data is read out in the vertical direction, namely, by the outer code sequence, it is possible to avoid the impossible operation to simultaneously write in and read out the data from the same memory chip.

The data is read out from six memory chips in accordance with the outer code sequence. More specifically, the data is read out in the vertical direction, in reference to FIGS. 16 and 17. In FIG. 16, r indicates the writing sequence of the unit of the inner code block and o represents the reading sequence of the unit of the inner code block.

Figures 18, 19:
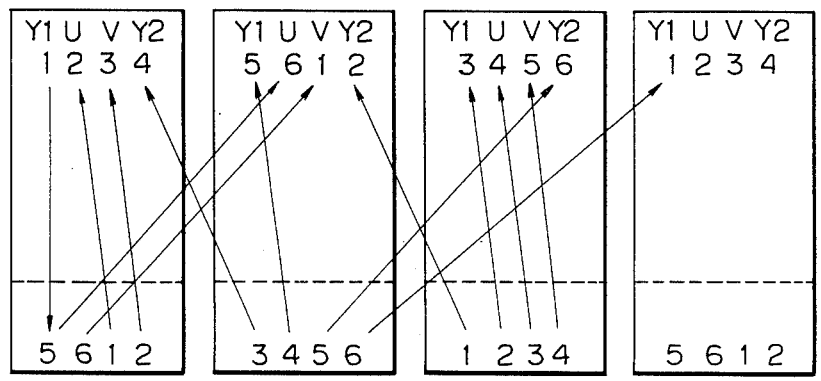
FIG. 18 is a diagrammatical representation useful in explaining the writing and reading operations relative to the buffer memory.
FIG. 19 is a diagrammatical representation useful in explaining the writing and reading operations relative to the buffer memory.

The reading sequence regarding the chip numbers will be more practically explained with reference to FIGS. 18 and 19, in which FIG. 18 shows a part of the sampling data which is included in the first row of the data arrangements of FIGS. 16 and 17 and is read out first A set of data (r=1, o=1, l=1) in FIG. 18 corresponds to a two-dimensional diagram showing the data blocks of one column (I=1) at the leftmost position of the set of data in FIG. 17. The next set of data (r=3 o=2, l=2) is a two-dimensional diagram showing the data blocks of one column (I=2) at the leftmost position of the relevant data block in FIG. 16. Likewise, a set of data (r=5, o=3, l=3) and a set of data (r=7, o=4, l=4) are shown in FIG. 18.

In the reading operation, every six samples of the chip numbers 1 to 6 in the vertical direction are read out in parallel from the six memory chips. In this case, as respectively shown in FIGS. 16, 17, and 18, after thirty-two sampling data were read out in the vertical direction, the chip number of the sampling data of the 32nd memory chip and three continuous dummy sampling data are added. Therefore, when the reading operation is shifted from the set of data (r=1, o=1, l=1) to the set of data (r=3, o=2, l=2) by the address control for deshuffling, the color difference data U is read out of memory chip number 6, as indicated by the arrows in FIG. 19, because the dummy sampling data of the chip numbers (3, 4, 5) exists.

Next, when the color difference data U and dummy sampling data are read out in the vertical direction, the luminance data $Y_1$ of the memory chip number 5 in the set of the same data is read out, because the dummy sampling data of the memory chip numbers (2, 3, 4) exists. When the luminance data $Y_1$ and dummy sampling data are read out in the vertical direction, the luminance data $Y_2$ of the chip number 4 of the set of data (r=1, o=1, l=1) is read out. Subsequently, the data is similarly read out in accordance with the sequence indicated by the arrows in FIG. 19. When the luminance data $Y_2$ of the set of data of (r=3, o=2, l=2) and the dummy sampling data of the chip numbers (4, 5, 6) are read out in the vertical direction all three data sets (r=1, o=1,=1), (r=3, o=2, l=2), and (r=5, o=3, l=3) are completely read out. The data of one horizontal interval 1 H is read out in accordance with the sequence shown in FIG. 19, so as to coincide with the inherent sequence of the digital color video signal as accurately as possible within 1 H. However, as the reading sequence of three data sets, various modifications other than that shown in FIG. 19 are also possible.

The sum of those three data sets is the data (30×4×3=360 samples) of 1 H which is recorded/reproduced by one rotary head. In the case of a unit of 1 H, the read data is obtained on the basis of the sequence that is coincident with the sequence of the digital color video signal because of the foregoing reading operation. The inherent sequence of the digital color video signal within 1 H is ($Y_1 \rightarrow U \rightarrow V \rightarrow Y_2$) for every set of data. Therefore, the data of six samples read out in parallel from the respective memory chips is converted into the serial data by the serial$\leftrightarrow$parallel converter and thereafter converted into the data having the inherent sequence of the data within 1 H by a memory having a relatively small capacity. Because the dummy sampling data is unnecessary, it is not used in the output of this small capacity memory.

Because the reading operation based on the sequences of FIGS. 18 and 19 is executed for every three data sets of 1 H, in the case of the data set (r=10, o=10, l=10), one set is constituted by this set and two data sets (r=1, o=1, l=1) and (r=3, o=2, l=12). In such case, the process similar to the above is applied.

By adding three dummy sampling data in the foregoing deshuffling process, data which was deshuffled in accordance with a sequence that is extremely similar to the inherent sequence of the digital color video signal can be obtained.

Even more detailed embodiments of buffer memory 11 are described with reference to FIGS. 20A and 20B, which show the circuits in which a dynamic RAM is used as the buffer memory 11.

Figure 20A:
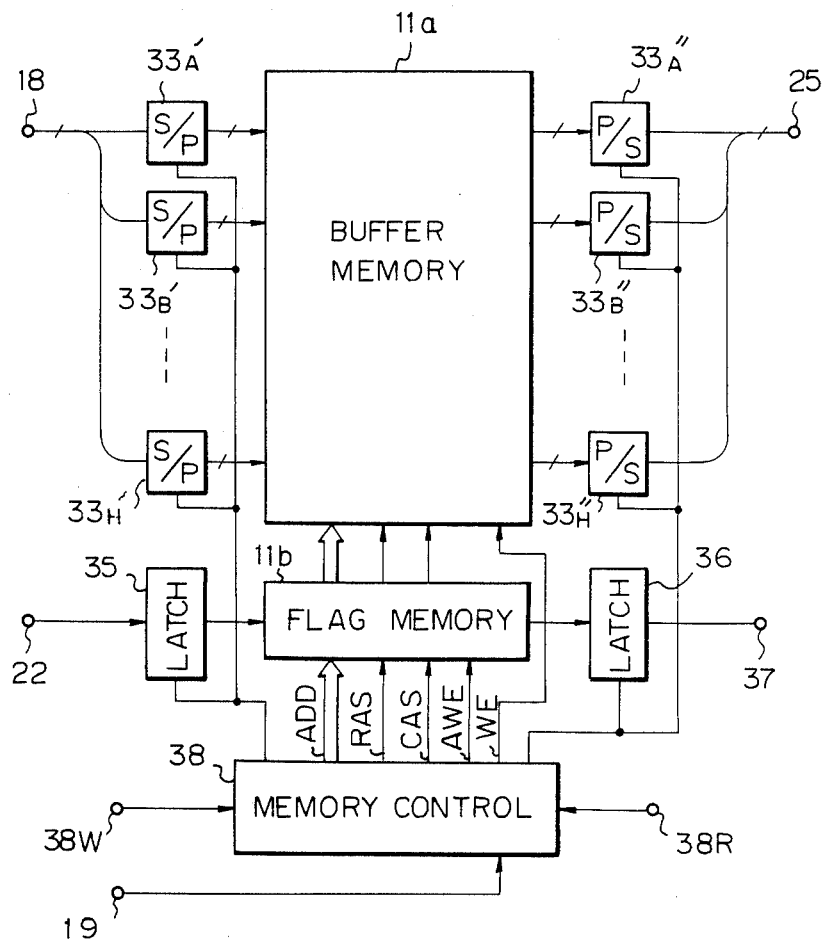
FIG. 20A is a schematic in block diagram form of a buffer memory system according to an embodiment of this invention.

First, referring to FIG. 20A, the input data is supplied through eight serial-to-parallel (S/P) converters $33_A'$, $33_B'$, ..., $33_H'$ to a buffer memory 11a to store the digital video signal. The output data of the buffer memory 11a is taken out through eight parallel-to-serial (P/S) converters $33_A''$, $33_B''$, ..., $33_H''$.

The input data consists of eight parallel bits of one sampling data and is sequentially supplied, one bit by one bit starting at the most significant bit, to the S/P converters $33_A'$ to $33_H'$ through input terminal 18. The data of fifteen parallel bits is formed for every corresponding number of bits of the same sequence, and the output data of fifteen parallel bits of the buffer memory 11a is converted back into serial data by P/S converters $33_A''$ to $33_H''$, respectively. Thus, the output data of eight parallel bits is obtained from the output terminal 25 of memory 11a.

The error flag of one bit from the inner code decoder 10 is supplied at input terminal 22 through a latch circuit 35 to a flag memory 11b to store the error data. The error flag read out of the flag memory 11b is taken out at an output terminal 37 through a latch circuit 36 and supplied to outer code decoder 12 together with the data read out of buffer memory 11a from terminal 25.

The write clock fed in at terminal 38W and the read clock fed in at terminal 38R are supplied to a memory control circuit 38. Further, the reproducing mode signal fed in at terminal 19 is fed to memory control circuit 38. The reproducing mode signal becomes, for example, a high level in the ordinary reproducing mode in which the tape speed upon recording is equal to the tape speed upon reproduction and, in the slow motion reproducing mode, in which the tape speed upon reproduction is slower than the tape speed upon recording. On the contrary, the reproducing mode signal becomes, for instance, a low level in the case where the tape speed upon reproduction is faster than the tape speed upon recording.

Memory control circuit 38 generates address data (ADD), a row address strobe signal (RAS), and a column address strobe signal (CAS), which are common to the buffer memory 11a and flag memory 11b. The memory control circuit 38 also generates a write enable signal WE for buffer memory 11a, a write enable signal AWE for flag memory 11b, and a latch pulse. The write clock is synchronized with the input data and is formed from a reference clock. Therefore, the time base variation component is removed by buffer memory 11a.

Although not specifically shown in FIG. 20A, the reproduction address for every sync block BS is supplied to memory control circuit 38 and the write address is determined on the basis of this reproduction address. Memory control circuit 38 controls one or both of the write address and read address, thereby executing the conversion from the inner code sequence into the outer code sequence and the deshuffling, and such address control is commonly performed for the buffer memory 11a and flag memory 11b. Thus, each sampling data and error flag of the output data are synchronized with each other.

Figure 20B:
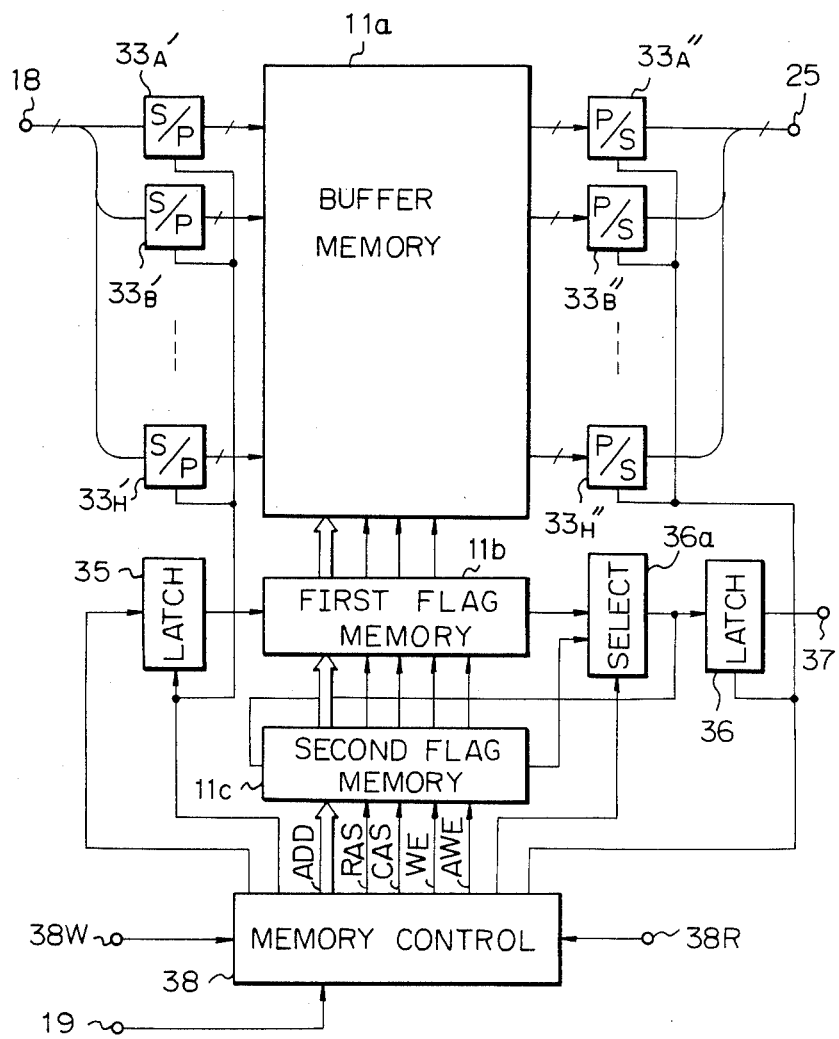
FIG. 20B is a schematic in block diagram form showing a constitution of a buffer memory system according to another embodiment of this invention.

FIG. 20B shows a buffer memory system representing another embodiment of buffer memory 11, in which the same parts and components as those shown in the buffer memory 11 of FIG. 20A are designated by the same reference numerals and their descriptions are omitted. Referring to FIG. 20B, a first flag memory 11b and a second flag memory 11c are provided to store error data as the flag memories. The one-bit error flag from latch circuit 35 is supplied to first flag memory 11b, and the error flag read out of the flag memory 11b is supplied to a latch circuit 36b through a selector 36a. The N/O flag is supplied form memory control circuit 38 to latch circuit 35. The error flag fed out at output terminal 37 from latch circuit 36b is supplied to the outer code decoder 12 together with the data read out of buffer memory 11a. The error flag read out of second flag memory 11c is supplied as the other input of the selector 36a. In this embodiment, a field identifying signal fed in at terminal 19 is fed to memory control circuit 38, and this field identifying signal consists of a reference field identifying signal on the readout side of buffer memory 11a and a reproduced field identifying signal based on the field address separated from the reproduced data. When the operation is shifted to the next field by the reference field identifying signal, selector 36a selects the error flag which is read out of second flag memory 11c in place of the error flag, which is read out of first flag memory 11b.

When the reproduced field identifying signal instructs a shift to the different field during one scan of rotary heads 7, selector 36a selects the error flag, read out of first flag memory 11b in place of the error flag read out of second flag memory 11c. Therefore, in the slow-motion reproducing mode, in the first field, the error flag read out of flag memory 11b is selected by selector 36a. Next, the error flag read out of flag memory 11c is selected by selector 36a for the period when the data of the same field is reproduced.

On the other hand, in the standard reproducing mode, after an expiration of one field period, the reproduced data of the next different field is generated, so that the error flag which is read out of first flag memory 11b is always selected. Further, in the high-speed reproducing mode, the data of a different field is reproduced by one scan, so that the error flag which is read out of first flag memory 11b is also always selected. The error flag selected by selector 36a is supplied to latch circuit 36b and second flag memory 11c.

Memory control circuit 38 generates the address data (ADD), row address strobe signal (RAS), and column address strobe signal (CAS), which are common to buffer memory 11a and flag memories 11b and 11c. Memory control circuit 38 also generates the write enable signal WE of buffer memory 11a, the write enable signal AWE of flag memories 11b and 11c, and the latch pulse.

The operations of the buffer memories of FIGS. 20A and 20B are described with reference to FIG. 21, in which A represents a timing signal used to specify the read cycle (R) and write cycle (W). Waveform B shows the timing of the addresses ADD that are supplied to the buffer memory 11a and flag memories 11b and 11c. In that regard, the column address is first set and the row address is then set, and waveform C shows the row address strobe signal RAS and waveform D shows the column address strobe signal CAS.

Buffer memory 11a performs the reading operation when the addresses ADD are specified, the address strobe signals RAS and CAS are sequentially set to a low level, the column address and row address are sequentially read, and the write enable signal WE goes to a high level. Buffer memory 11a executes the writing operation when the address strobe signals RAS and CAS are sequentially set to a low level, the addresses are read, and the write enable signal WE goes to a low level. Although the writing and reading operations of flag memories 11b and 11c are also executed in a manner similar to the above, they are controlled by another write enable signal AWE different from that of buffer memory 11a.

Figure 21:
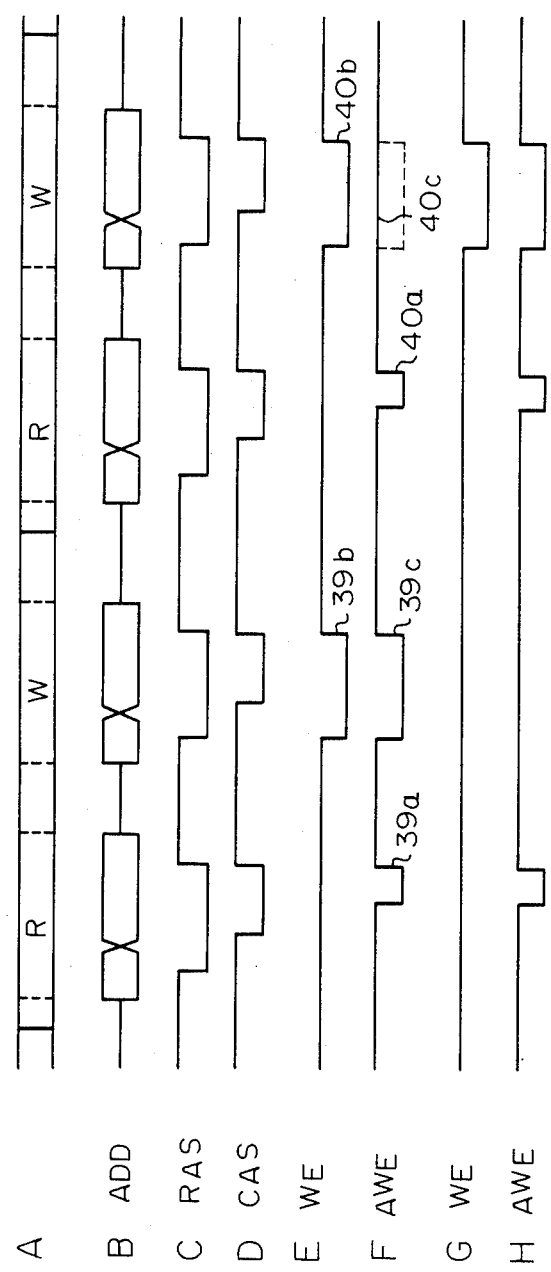
FIG. 21 comprises waveforms and time charts, A through H, useful in explaining the operations of the buffer memories shown in FIGS. 20A and 20B.

Waveforms E and F of FIG. 21 show examples of the write enable signals WE and AWE in the ordinary reproducing mode, respectively, present in the embodiment of FIG. 20A. The write enable signal WE shown in waveform E always goes to a low level in the write cycle. Therefore, the input reproduced data is sequentially written into buffer memory 11a.

In waveform as shown at reference numerals 39a and 40a, the write enable signal AWE of flag memory 11a goes to a low level immediately after the error flag of the designated address is read out. Then the error flag representing that the error exists in this designated address is written. If the data that is written into buffer memory 11a for interval 39b when the write enable signal WE is at a low level has no error, the error flag indicative of no error is written into flag memory 11a for an interval 39c when the write enable signal AWE is at a low level, then the error flag is rewritten.

On the other hand, if the data which is written into buffer memory 11a for an interval 40b has errors, the write enable signal AWE is held at a high level for an interval 40c and the error flag is not rewritten. In this manner, in the ordinary reproducing mode, as well as in the slow-motion reproducing mode in which the data of the outer code block BO is reproduced for a few fields, both the data from the inner code decoder 10 and the error flag are written into buffer memory 11a and flag memory 11b.

In FIG. 21 waveforms G and H show examples of the write enable signals WE and AWE in the high-speed reproducing mode, respectively. In a manner similar to the case in the ordinary reproducing mode and slow-motion reproducing mode, in the high-speed reproducing mode the error flag is written into flag memory 11b after the data is read out of buffer memory 11a, so that it is indicated that the data of that address was previously reproduced. In addition, the error data is not written into buffer memory 11a, but the data having no error is written into buffer memory 11a, the error flag indicative of no error is written into flag memory 11b, and the error flag is rewritten. The data and error flags respectively read out of buffer memory 11a and flag memory 11b are not subjected to the error correcting process by outer code decoder 12 but are directly supplied to the error concealment circuit 13, by which the error concealment is executed.

In the embodiment of FIG. 20B, the write enable signal WE shown in waveform E of FIG. 21 goes to a low level in the write cycle in the case of data having no error. Therefore, the input reproduced data having no error is written into buffer memory 11a. As shown in waveform F, the write enable signal AWE of flag memories 11b and 11c is set at a low level immediately after the error flag of the designated address is read out. The error flag representing the presence of the errors is written into the designated address of flag memory 11b through latch circuit 35, and the error flag read out of flag memory 11b through selector 36a is written into the other flag memory 11c. Therefore, the error flag of flag memory 11b is copied into flag memory 11c. In the case where the data that is written into buffer memory 11a for the low-level interval has no error, the error flag indicative of the absence of error is written into flag memory 11b for the interval when the write enable signal AWE in the write cycle is at a low level, and the error flag is rewritten.

In the slow-motion reproducing mode, selector 36A selects the output of flag memory 11c upon reading of the same field at the second and subsequent times. Thus, the error flag copied into flag memory 11c is repeatedly outputted for every field.

Assuming that the memories of the fields provided in buffer memories 11a are denoted as $FM_1$, $FM_2$, and $FM_3$, respectively, when the tracks $T_1$ and $T_2$ in FIG. 5 are scanned, the reproduced data of the preceding field $F_O$ which was reproduced by the former half part of the scan is written into the field memory $FM_3$, and the reproduced data of the next field $F_1$, which was reproduced by the latter half part of the scan, is written into the field memory $FM_1$. For the interval from the last half parts of the tracks $T_1$ and $T_2$ to the first half parts of the tracks $T_{11}$ and $T_{12}$, the reproduced data of the field $F_1$ is written into the field memory $FM_1$ and at the same time, the data of the field $F_O$ is read out of the field memory $FM_3$. For the interval after the last half parts of the tracks $T_{11}$ and $T_{12}$, the reproduced data of the field $F_2$ is written into the field memory $Fm_2$ and at the same time, the data of the field $F_1$ is read out of the field memory $FM_1$. In a manner similar to the above, the above operation is repeated.

In the slow-motion reproducing mode in which the speed of the magnetic tape is, for example, ½ of the recording speed, it takes a time that is twice as long as in the standard reproducing mode in order to reproduce the data of the field $F_1$. Therefore, for the interval of those two fields, the data of the preceding field $F_O$ stored in the field memory $FM_3$ is repeatedly read out. The selector 36a selects the error flag read out of flag memory 11b in the first reading operation of the data of the field $F_O$ from the field memory $FM_3$. In the next second reading operation, selector 36a selects the error flag read out of flag memory 11c and, because the field of the reproduced data changes upon scanning of the tracks $T_{11}$ and $T_{12}$, selector 36a selects the error flag from flag memory 11b.

The present invention is not limited to a digital VTR of an individual component system, but may be also applied to the digital VTR of the composite system, as well as to other apparatus using other similar error correction code techniques.

The invention can be also applied to an apparatus for decoding an error correction code in which the code sequence is orranged in the oblique direction of a two-dimensional arrangement of the data. The error correction code is not limited to the Reed-Solomon code but various other kinds of correction codes and such as b-adjacent code, BCH code, which are conventionally known may also be used.

According to the present invention, by providing a memory to rearrange the inner code sequence into the outer code sequence between the decoder of the inner code and the decoder of the outer code, it is possible to execute the rearranging process using a memory of capacity only as large as is necessary to recover the video data in the variable speed reproducing mode. Therefore, there is no need to provide a memory for use only in the data rearrangement, with the result that the memory scale can be reduced and the number of peripheral circuits of the memory can be decreased.

In addition, according to this invention, by use of the memory of a large capacity necessary to recover the video data in the variable speed reproducing mode, there is no need to provide a memory for use only in the deshuffling process. Thus, the necessary capacity of the memory and the number of peripheral circuits of the memory can be also reduced.

Further, according to,the invention in the case where the data of one field is obtained from a plurality of scanning operations by the rotary heads, as in the slow motion reproducing mode, the error correction can be executed using the outer code, so that a good reproduced picture quality can be obtained.

In the case of providing a plurality of memory chips in parallel in the memory to solve the drawback in which the processing speed of the memory is slow, by providing a predetermined number of dummy data upon either one or both of the writing and reading operations, the simultaneous access of the same memory chip can be prevented.

In addition, according to this invention, by writing the error data into the buffer memory in the ordinary reproducing mode and the slow-motion reproducing mode, this error data can be corrected by the outer code decoder at the next stage. In this way, the error correcting capability can be improved According to this invention, when the reproduced data is read out of the buffer memory, the flag is read out together with the data and the next flag that is read out immediately after that is changed to the flag indicating that the readout reproduced data is the preceding reproduced data. Therefore, it is possible to prevent deterioration of the reproduced image due to a mixture of the preceding reproducted data. On the other hand, according to the invention, the readout flag is written into the second flag memory and the auxiliary flag from the second flag memory is used as the flag when the data of the same field is read out two or more times. Thus, it is possible to prevent the problem such that all of the flags of the data read out at the second subsequent times indicate the preceding reproduced data.

The above description is presented on preferred embodiments of the invention, but it will be apparent that many modifications and variations can be effected by one skilled in the art without departing from the spirit and scope of the novel concepts of the invention, which should be determined only by the appended claims.

What is claimed is:

1. Apparatus for decoding an error detecting/correcting code that is derived from digital information data and redundant data used for detecting/correcting the information data, in which the digital information data and redundant data are reproduced by a playback unit at selectably normal and variable speeds from a record medium, comprising:

first decoding means responsive to said digital information data and said error detecting/correcting code for decoding said error detecting/correcting code and generating therefrom flag data indicating errors in said digital information data and corrected digital information data;

first memory means connected for storing said corrected digital information data;

second memory means connected for storing said flag data; and control means connected to receive a mode signal indicative of a selected speed of the playback unit for producing contorl signals fed to said first and second memory means, said control signals being operative when said mode signal indicates the normal playback speed to control said first and second memory means to have written therein said digital information data and said flag data, respectively, and said control signals being operative when said mode signal indicates a variable playback speed to control said first and second memory means to have written therein said corrected digital information data and said flag data, respectively.

2. An apparatus according to claim 1, wherein said error detecting/correcting code constructed from said digital information data is arranged in a matrix form, with first redundant data forming a first error detecting/correcting code for detecting or correcting error of a first series of said digital information data in a first direction of said matrix, and second redundant data forming a second error detecting/correcting code for detecting or correcting error of a second series of said digital information data in a second direction of said matrix, the digital information data, first redundant data and second redundant data being reproduced from said record medium by the playback apparatus, in which said first decoding means decodes said second error detecting or correcting code, and said first memory means stores said digital information data and first redundant data subjected to the decoding in said first decoding means for outputting said digital information data and first redundant data arranged in said first series of said first error detecting or correcting code; and further comprising second decoding means provided with said digital information data and first redundant data from said first memory means for decoding said first error detecting or correcting code.

3. Apparatus for decoding an error detecting and correcting code produced from digital information data reproduced from a record medium by a playback unit selectively operable in normal and varied playback speed modes, in which a speed signal indicates the selected playback speed mode and the code is a produce code formed of an inner code and an outer code, comprising:

an inner decoder responsive to said digital information data and said error detecting and correcting code for decoding the error detecting and correcting code and producing decoded digital information data and error flag data indicating error conditions of the digital information data;

a memory means connected to have written therein said decoded digital inforamtion data and said error flag data;

memory control means operably connected to said memory means and responsive to said speed signal for controlling writing and reading of said decoded digital information data and said error flag data into and out of said memory means; and an outer decoder connected to said memory means for decoding the digital information data and the error flag data from said memory means for producing an error corrected digital information signal, in which all errors of an extent determined by said inner and outer codes are corrected.

4. Apparatus according to claim 3, further comprising error concealment means connected to said outer decoder for concealing errors in said error corrected digital information signal greater than said extent determined by inner and outer codes.

5. Apparatus according to claim 4, in which said error concealment means comprises interpolation means for concealing errors by interpolating a correct value of data based on adjacent correct data.

6. Apparatus according to claim 3, in which said memory means comprises a buffer memory and an error flag memory and said memory control means operates in response to an indication of the normal playback speed to control said buffer memory to have written therein only correct decoded digital information data and to control said error flag memory to have said error flag data written therein.

7. Apparatus according to claim 3 in which said memory means comprises a plurality of memory chips connected as a plurality of parallel channels for storing data from a serial-to-parallel-to-serial converter receiving a serial decode digital information signal from said first encoder, each of said memory chips being controlled to read/write data from said serial-to-parallel-to-serial converter by a control signal from said memory control means.

8. Apparatus according to claim 3, in which said memory means comprises a buffer memory and first and second error flag memories and said memory control means operates in response to an indication of a varied playback speed mode corresponding to a slow-motion playback for controlling said first error flag memory for storing error flag data indicating data already read and for controlling said second error flag means for storing error flag data from said first error flag data from said first error flag memory, whereby during the slow-motion mode data in said buffer memory is repeatedly read out and error flag data in said second error flag memory is read out.

* * * * *